(12) United States Patent
Cheng et al.

(10) Patent No.: US 11,088,188 B2
(45) Date of Patent: Aug. 10, 2021

(54) IMAGE SENSOR DEVICE

(71) Applicant: Taiwan Semiconductor Manufacturing Co., Ltd., Hsinchu (TW)

(72) Inventors: Yun-Wei Cheng, Taipei (TW); Chun-Hao Chou, Tainan (TW); Kuo-Cheng Lee, Tainan (TW); Hsun-Ying Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/595,729

(22) Filed: Oct. 8, 2019

(65) Prior Publication Data
US 2020/0035732 A1 Jan. 30, 2020

Related U.S. Application Data

(62) Division of application No. 15/807,980, filed on Nov. 9, 2017, now Pat. No. 10,468,444.

(51) Int. Cl.
*H01L 27/146* (2006.01)
(52) U.S. Cl.
CPC .... *H01L 27/14623* (2013.01); *H01L 27/1463* (2013.01); *H01L 27/1464* (2013.01); *H01L 27/14621* (2013.01); *H01L 27/14627* (2013.01); *H01L 27/14636* (2013.01); *H01L 27/14685* (2013.01); *H01L 27/14687* (2013.01); *H01L 27/14689* (2013.01); *H01L 27/1462* (2013.01); *H01L 27/14629* (2013.01); *H01L 27/14645* (2013.01)

(58) Field of Classification Search
None
See application file for complete search history.

(56) References Cited

U.S. PATENT DOCUMENTS

| | | | | |
|---|---|---|---|---|
| 9,985,072 | B1* | 5/2018 | Wen | H01L 27/146 |
| 10,043,841 | B1* | 8/2018 | Chang | H01L 27/14685 |
| 10,153,319 | B2* | 12/2018 | Wen | H01L 27/14643 |
| 2009/0200625 | A1* | 8/2009 | Venezia | H01L 27/14645 |
| | | | | 257/432 |

(Continued)

*Primary Examiner* — Zandra V Smith
*Assistant Examiner* — Lawrence C Tynes, Jr.
(74) *Attorney, Agent, or Firm* — Birch, Stewart, Kolasch & Birch, LLP

(57) ABSTRACT

An image sensor device is provided. The image sensor device includes a substrate having a front surface, a back surface, and a light-sensing region. The image sensor device includes a first isolation structure extending from the front surface into the substrate. The first isolation structure includes a first insulating layer and an etch stop layer, the first insulating layer extends from the front surface into the substrate, the etch stop layer is between the first insulating layer and the substrate, and the etch stop layer, the first insulating layer, and the substrate are made of different materials. The image sensor device includes a second isolation structure extending from the back surface into the substrate. The second isolation structure is in direct contact with the etch stop layer, the second isolation structure surrounds the light-sensing region, and the second isolation structure includes a light-blocking structure.

20 Claims, 15 Drawing Sheets

(56) References Cited

U.S. PATENT DOCUMENTS

| | | | |
|---|---|---|---|
| 2009/0286346 A1* | 11/2009 | Adkisson | H01L 27/14632 438/65 |
| 2010/0148295 A1* | 6/2010 | Brady | H01L 27/14601 257/447 |
| 2012/0025199 A1* | 2/2012 | Chen | H01L 27/1464 257/75 |
| 2015/0243805 A1* | 8/2015 | Chien | H01L 27/1464 257/432 |
| 2018/0151615 A1* | 5/2018 | Wen | H01L 27/14623 |
| 2018/0151759 A1* | 5/2018 | Huang | H01L 31/0232 |
| 2018/0240838 A1* | 8/2018 | Wen | H01L 27/1462 |

* cited by examiner

IMAGE SENSOR DEVICE

CROSS REFERENCE

This application is a Divisional of U.S. application Ser. No. 15/807,980, filed on Nov. 9, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs. For these advances, similar developments in IC processing and manufacturing are needed.

Along with the advantages realized from reducing geometric size, improvements are being made directly to the IC devices. One such IC device is an image sensor device. An image sensor device includes a pixel array (or grid) for detecting light and recording intensity (brightness) of the detected light. The pixel array responds to the light by accumulating a charge. The higher the light intensity, the greater the charge that is accumulated in the pixel array. The accumulated charge is then used (for example, by other circuitry) to provide image information for use in a suitable application, such as a digital camera.

However, since the feature sizes continue to decrease, fabrication processes continue to become more difficult to perform. Therefore, it is a challenge to form reliable image sensor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
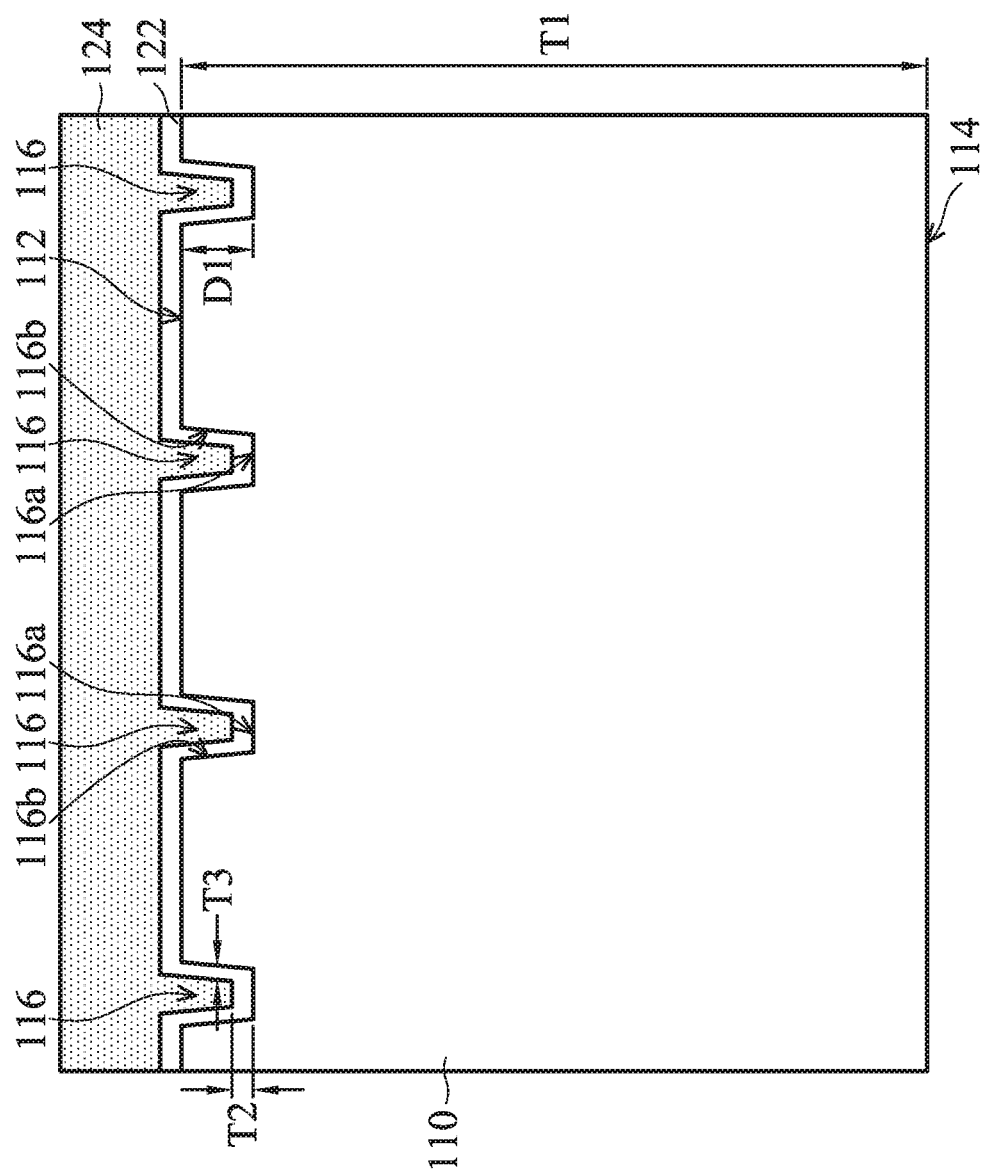
FIGS. 1A-1E are cross-sectional views of various stages of a process for forming an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIGS. 1A-1E are cross-sectional views of various stages of a process for forming an image sensor device 100, in accordance with some embodiments. As shown in FIG. 1A, a semiconductor substrate 110 is provided. The semiconductor substrate 110 has a front surface 112 and a back surface 114 opposite to the front surface 112. The semiconductor substrate 110 has a thickness T1, in accordance with some embodiments. The thickness T1 is equal to a distance between the front surface 112 and the back surface 114, in accordance with some embodiments.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include other elementary semiconductor materials such as germanium.

As shown in FIG. 1A, a portion of the semiconductor substrate 110 is removed to form a trench 116 in the semiconductor substrate 110, in accordance with some embodiments. The trench 116 extends from the front surface 112 into the semiconductor substrate 110, in accordance with some embodiments. The trench 116 surrounds the portions of the semiconductor substrate 110, in accordance with some embodiments.

The trench 116 has a bottom surface 116a and inner walls 116b, in accordance with some embodiments. The inner walls 116b are connected to (or adjacent to) the bottom surface 116a, in accordance with some embodiments. The trench 116 has a depth D1, in accordance with some embodiments. In some embodiments, a ratio of the depth D1 to the thickness T1 ranges from about 0.02 to about 0.5.

As shown in FIG. 1A, an etch stop layer 122 is formed over the semiconductor substrate 110 to cover the bottom surface 116a, the inner walls 116b, and the front surface 112, in accordance with some embodiments. The etch stop layer 122 covering the bottom surface 116a has a thickness T2, in accordance with some embodiments. The etch stop layer 122 covering the inner walls 116b has a thickness T3, in accordance with some embodiments. The thickness T2 is greater than the thickness T3, in accordance with some embodiments.

The etch stop layer 122 is used to control a subsequent etch process performed on the semiconductor substrate 110, in accordance with some embodiments. The etch stop layer 122 and the semiconductor substrate 110 are made of different materials, in accordance with some embodiments. The etch stop layer 122 is made of an insulating material, in accordance with some embodiments.

The etch stop layer 122 is made of silicon nitride, silicon oxynitride, silicon dioxide, silicon carbide, a combination thereof, or the like, in accordance with some embodiments. The etch stop layer 122 is formed using a deposition process, such as a chemical vapor deposition process, a physical vapor deposition process, an atomic layer deposition process, or another suitable deposition process.

As shown in FIG. 1A, an insulating layer 124 is formed over the etch stop layer 122, in accordance with some embodiments. The insulating layer 124 is filled in the trench 116, in accordance with some embodiments. The etch stop layer 122, the insulating layer 124, and the semiconductor substrate 110 are made of different materials, in accordance with some embodiments.

The insulating layer 124 is made of silicon dioxide, silicon nitride, silicon oxynitride, fluoride-doped silicate glass (FSG), a low-K dielectric material, another suitable insulating material, or combinations thereof. The insulating layer 124 is formed using a deposition process, such as a chemical vapor deposition process, a physical vapor deposition process, or another suitable deposition process.

Figure 1B:
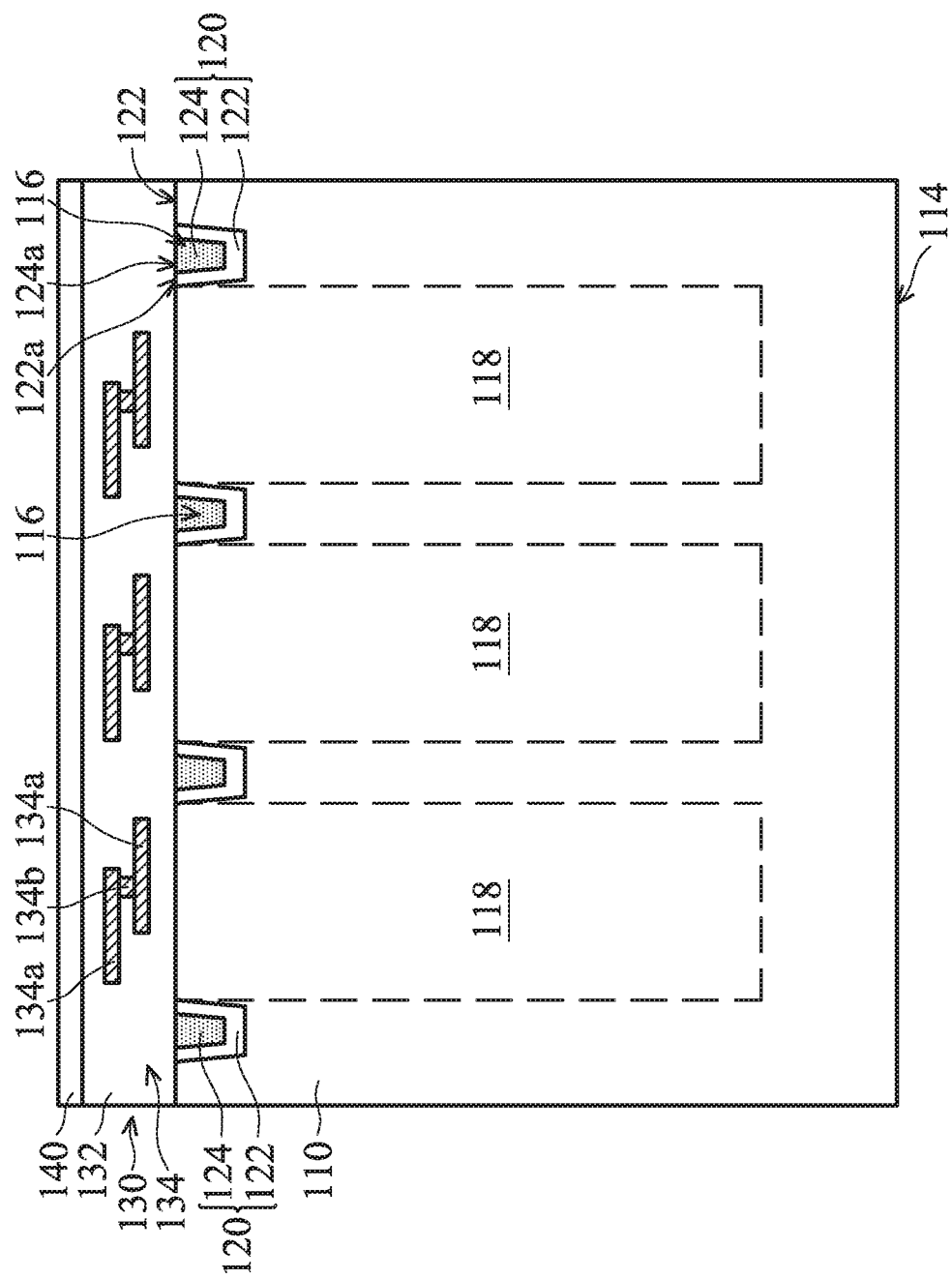

As shown in FIG. 1B, the insulating layer 124 and the etch stop layer 122 outside of the trench 116 are removed, in accordance with some embodiments. After the removal process, the insulating layer 124 and the etch stop layer 122 remaining in the trench 116 together form an isolation structure 120, in accordance with some embodiments.

In some embodiments, the isolation structure 120 is used to define subsequently formed light-sensing regions in the semiconductor substrate 110, and to electrically isolate neighboring devices (e.g. transistors) from one another. In some embodiments, the isolation features 120 are formed adjacent to or near the front surface 112.

The removal process includes a planarization process, such as a chemical mechanical polishing process, in accordance with some embodiments. Therefore, a top surface 122a of the etch stop layer 122 and a top surface 124a of the insulating layer 124 are substantially coplanar (or substantially aligned with each other), in accordance with some embodiments. The term "substantially coplanar" in the application may include small deviations from coplanar geometries. The deviations may be due to manufacturing processes.

Figure 2A:
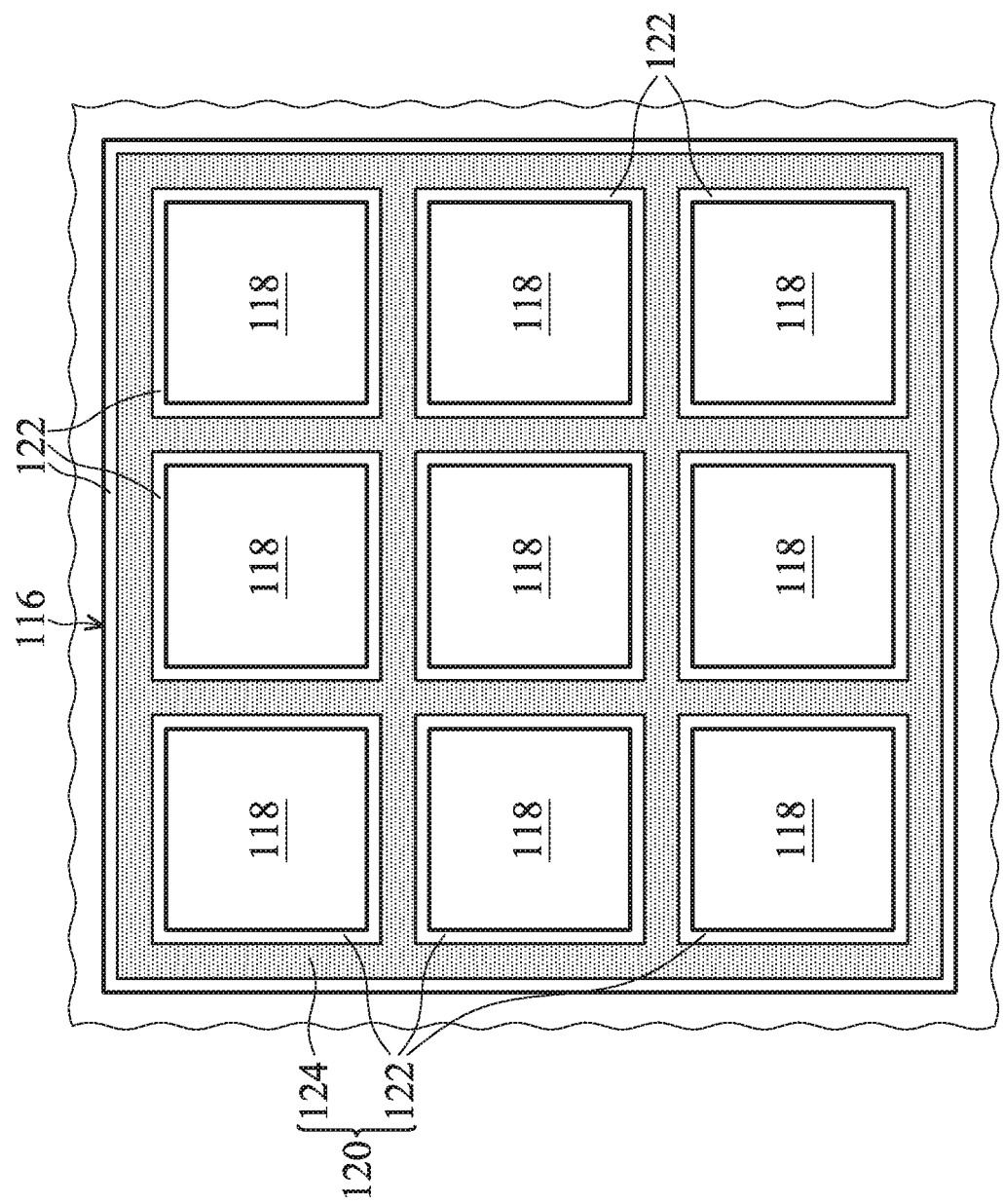
FIG. 2A is a top view of the semiconductor substrate, the etch stop layer, and the insulating layer of FIG. 1B, in accordance with some embodiments.

FIG. 2A is a top view of the semiconductor substrate 110, the etch stop layer 122, and the insulating layer 124 of FIG. 1B, in accordance with some embodiments. As shown in FIGS. 1B and 2A, light-sensing regions 118 are formed in the portions of the semiconductor substrate 110 surrounded by the trench 116 (or the isolation structure 120), in accordance with some embodiments. The light-sensing regions 118 are also referred to as radiation-sensing regions, in accordance with some embodiments.

The light-sensing regions 118 are formed using one or more ion implantation processes or diffusion processes, in accordance with some embodiments. The light-sensing regions 118 are doped with a doping polarity opposite from that of the semiconductor substrate 110. The light-sensing regions 118 are formed close to (or adjacent to, or near) the front surface 112 of the semiconductor substrate 110.

The light-sensing regions 118 are operable to sense incident light (or incident radiation) that enters the light-sensing regions 118. The incident light may be visible light. Alternatively, the incident light may be infrared (IR), ultraviolet (UV), X-ray, microwave, other suitable types of light, or a combination thereof.

Image sensing elements are formed over the light-sensing regions 118, and for the sake of simplicity, detailed structures of the image sensing elements are not shown in figures of the present disclosure, in accordance with some embodiments. The image sensing elements include pinned layers, photodiode gates, reset transistors, source follower transistors, and transfer transistors, in accordance with some embodiments.

The transfer transistors are electrically connected with the light-sensing regions 118 to collect (or pick up) electrons generated by incident light (incident radiation) traveling into the light-sensing regions 118 and to convert the electrons into voltage signals, in accordance with some embodiments.

As shown in FIG. 1B, an interconnection structure 130 is formed over the front surface 112, in accordance with some embodiments. The interconnection structure 130 includes a number of patterned dielectric layers and conductive layers that couple to various doped features, circuitry, photodiode gates, reset transistors, source follower transistors, and transfer transistors. For example, the interconnection structure 130 includes an interlayer dielectric (ILD) layer 132 and a multilayer interconnection (MLI) structure 134 in the ILD layer 132.

The MLI structure 134 includes conductive lines 134a and vias (or contacts) 134b connected between the conductive lines 134a. It should be understood that the conductive lines 134a and the vias 134b are merely exemplary. The actual positioning and configuration of the conductive lines 134a and the vias 134b may vary depending on design needs and manufacturing concerns.

Figure 1C:
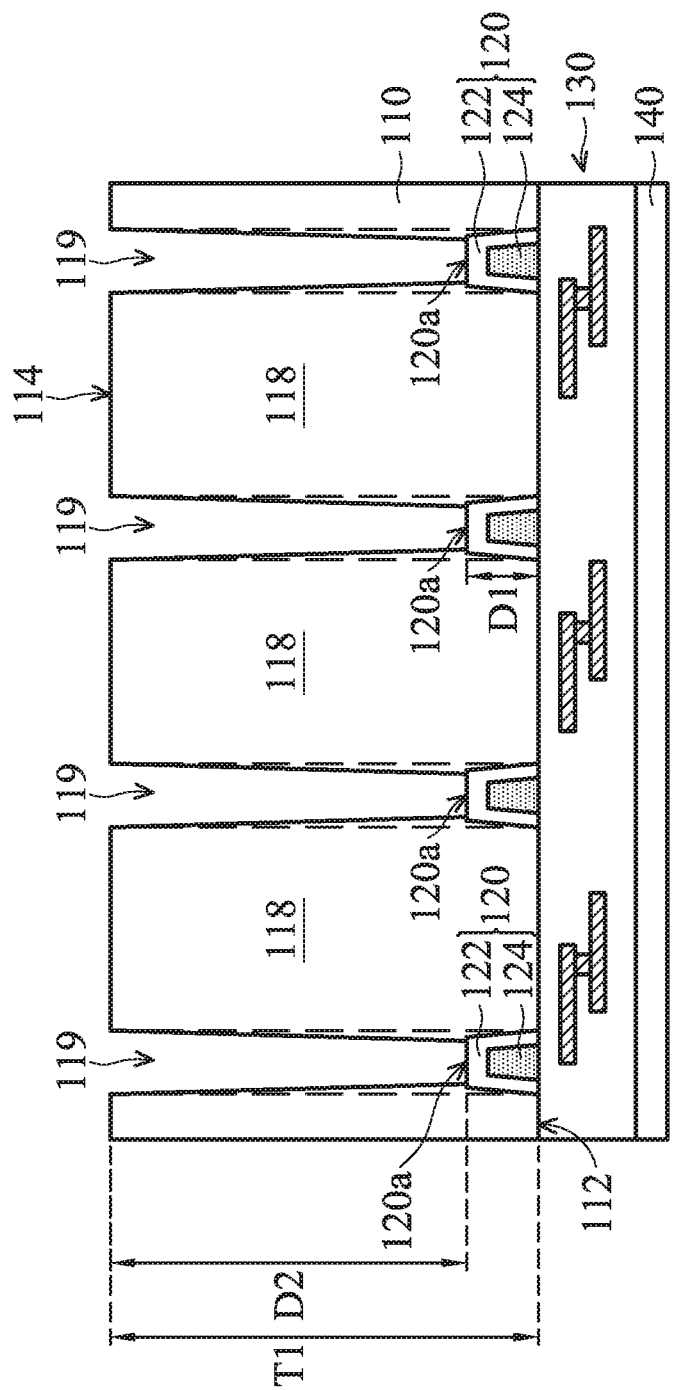

Afterwards, a carrier substrate 140 is bonded with the interconnection structure 130, in accordance with some embodiments. The carrier substrate 140 includes a silicon substrate, a glass substrate or another suitable substrate. Thereafter, as shown in FIGS. 1B and 1C, a thinning process is performed to thin the semiconductor substrate 110 from the back surface 114. The thinning process may include a chemical mechanical polishing process.

Afterwards, as shown in FIG. 1C, the semiconductor substrate 110 is flipped over, and a trench 119 is formed in the semiconductor substrate 110, in accordance with some embodiments. The trench 119 extends from the back surface 114 into the semiconductor substrate 110, in accordance with some embodiments. The trench 119 is between each two adjacent light-sensing regions 118, in accordance with some embodiments. The trench 119 surrounds each of the light-sensing regions 118, in accordance with some embodiments.

In some embodiments, the trench 119 is above the isolation structure 120. In some embodiments, the trench 119 exposes the isolation structure 120. The isolation structure 120 has a surface (or an end surface) 120a facing the back surface 114, in accordance with some embodiments. The trench 119 exposes the surface 120a, in accordance with some embodiments. The trench 119 exposes the etch stop layer 122, in accordance with some embodiments.

The trench 119 has a depth D2, in accordance with some embodiments. In some embodiments, a ratio of the depth D2 of the trench 119 to the thickness T1 of the semiconductor substrate 110 ranges from about 0.2 to about 0.98. In some embodiments, the ratio of the depth D1 of the trench 119 to the thickness T1 of the semiconductor substrate 110 ranges from about 0.5 to about 0.98. The depth D2 is greater than the depth D1, in accordance with some embodiments.

Figure 1D:
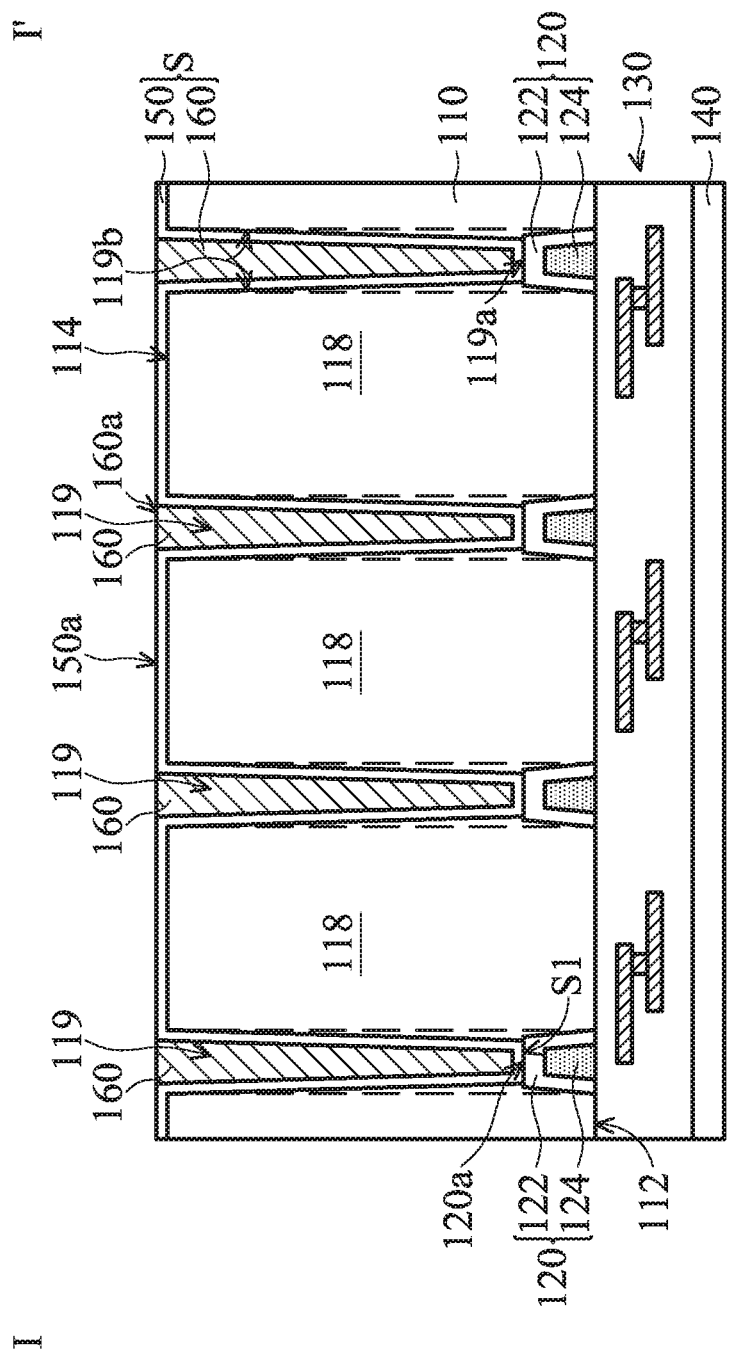

Afterwards, as shown in FIG. 1D, an insulating layer 150 is formed over the back surface 114 and in the trench 119, in accordance with some embodiments. The insulating layer 150 continuously and conformally covers a bottom surface 119a (i.e. the surface 120a) and the inner walls 119b of the trench 119 and the back surface 114, in accordance with some embodiments.

The insulating layer 150 is also referred to as a liner layer, in accordance with some embodiments. The insulating layer 150 is in direct contact with the isolation structure 120 and the semiconductor substrate 110, in accordance with some embodiments. The insulating layer 150 is in direct contact with the etch stop layer 122, in accordance with some embodiments.

In some embodiments, the insulating layer 150 is used to passivate the back surface 114, the bottom surface 119a, and the inner walls 119b. In some embodiments, the insulating layer 150 is also used to electrically isolate the light-sensing regions 118 from one another to reduce electrical crosstalk between the light-sensing regions 118.

The insulating layer 150 includes silicon dioxide, in accordance with some embodiments. The insulating layer 150 includes a high-k material, a dielectric material, or other suitable insulating materials. The high-k material may include hafnium oxide, tantalum pentoxide, zirconium dioxide, aluminum oxide, other suitable materials, or a combination thereof.

The dielectric material includes, for example, silicon nitride, silicon oxynitride, other suitable materials, or a combination thereof. The insulating layer 150 is formed by, for example, a thermal oxidation process or a deposition process, such as a chemical vapor deposition process or a physical vapor deposition process.

Thereafter, as shown in FIG. 1D, a light-blocking structure 160 is formed in the trench 119, in accordance with some embodiments. The light-blocking structure 160 is formed over the insulating layer 150, in accordance with some embodiments. A top surface 150a of the insulating layer 150 and a top surface 160a of the light-blocking structure 160 are substantially coplanar, in accordance with some embodiments.

Figure 2B:
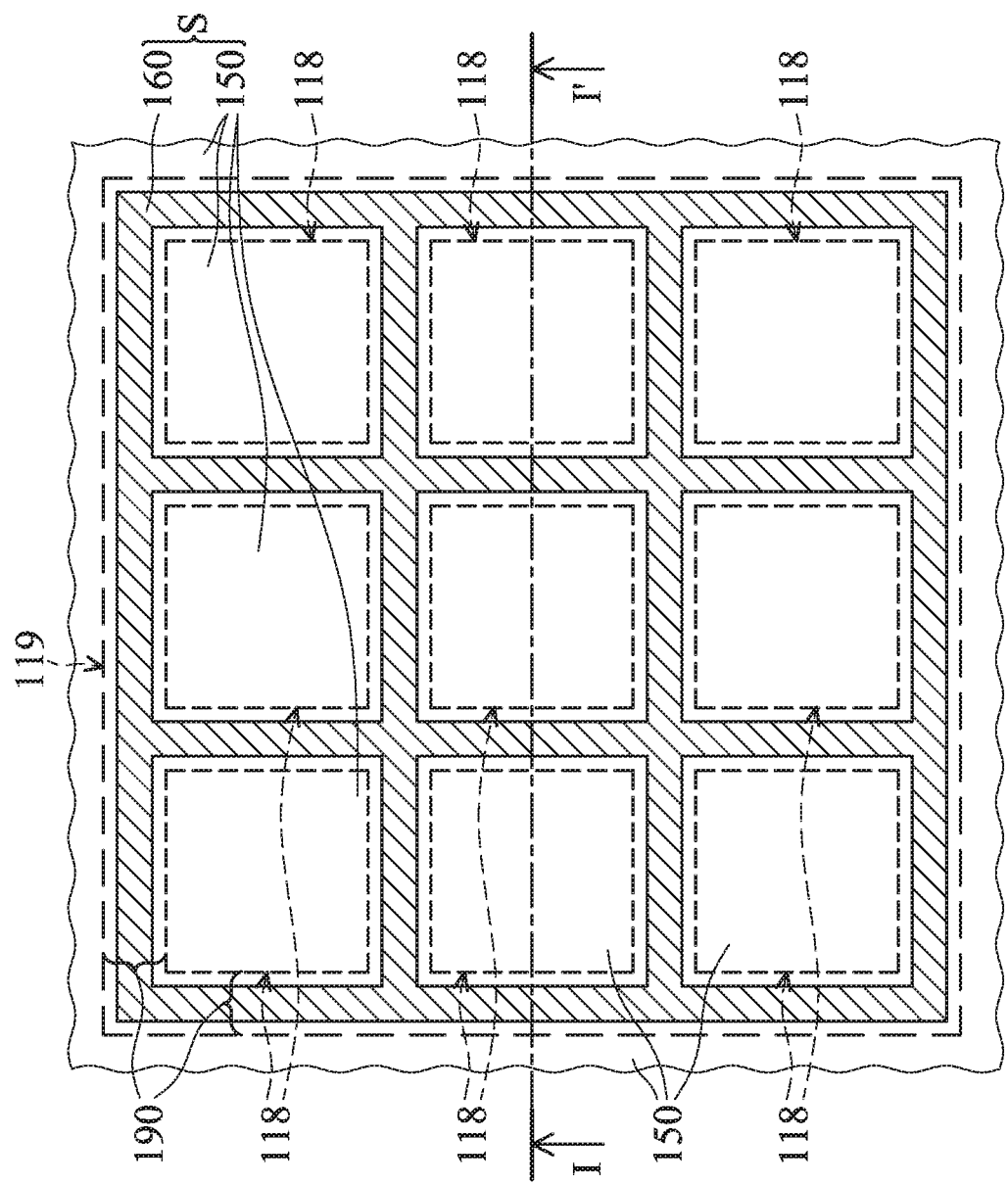
FIG. 2B is a top view of the light-blocking structure and the insulating layer of FIG. 1D, in accordance with some embodiments.

FIG. 2B is a top view of the light-blocking structure 160 and the insulating layer 150 of FIG. 1D, in accordance with some embodiments. FIG. 1D is a cross-sectional view illustrating an intermediate structure of an image sensor device along a sectional line I-I' in FIG. 2B, in accordance with some embodiments. As shown in FIGS. 1D and 2B, the trench 119 and the light-blocking structure 160 therein surround each of the light-sensing regions 118, in accordance with some embodiments.

The insulating layer 150 is between the light-blocking structure 160 and the semiconductor substrate 110 to separate the light-blocking structure 160 from the semiconductor substrate 110, in accordance with some embodiments. The insulating layer 150 electrically insulates the light-blocking structure 160 from the semiconductor substrate 110, in accordance with some embodiments.

The trench 119 is filled with the insulating layer 150 and the light-blocking structure 160, in accordance with some embodiments. The light-blocking structure 160 is between each two adjacent light-sensing regions 118, in accordance with some embodiments. The light-blocking structure 160 is used to block incident light to prevent the incident light from traveling between different light-sensing regions 118, in accordance with some embodiments.

In some embodiments, the light-blocking structure 160 includes a light reflection structure. In some embodiments, the light reflection structure has a lower refractive index than that of the semiconductor substrate 110, and therefore a portion of the incident light arriving at the light reflection structure is reflected, which is a phenomenon called "total internal reflection". The light reflection structure includes dielectric materials, such as silicon dioxides, silicon nitrides, or silicon carbides.

In some embodiments, the light reflection structure has a light reflectivity ranging from about 60% to about 100%. In some embodiments, the light reflection structure includes a metal material or an alloy material. The light reflection structure includes Al, W, Cu, Ti, an alloy thereof, a combination thereof, or another suitable reflective material.

Alternatively, in some embodiments, the light-blocking structure 160 includes a light absorption structure. In some embodiments, the light absorption structure has a light absorptivity ranging from about 60% to about 100%. In some embodiments, the light absorption structure is used to absorb the incident light arriving at the light absorption structure to prevent the incident light from traveling between different light-sensing regions 118.

In some embodiments, the light absorption structure includes a black silicon material, a semiconductor material with a band gap smaller than 1.5 eV (e.g., Ge, InSb. or InAs), or a polymer material (e.g., an opaque polymer material). In some embodiments, the light absorption structure includes a non-visible light filter (e.g. an IR filter or a UV filter) enabled to block visible light and transmit non-visible light.

In some embodiments, the method of forming the light-blocking structure 160 includes depositing a light-blocking material layer on the semiconductor substrate 110 and filled in the trench 119; and removing the light-blocking material layer outside of the trench 119.

The method of depositing the light-blocking material layer includes performing a chemical vapor deposition (CVD) process, a physical vapor deposition (PVD) process, a coating process, or another suitable process. The method of removing the light-blocking material layer outside of the trench 119 includes performing a chemical mechanical polishing (CMP) process or another suitable process.

The light-blocking structure 160 and the insulating layer 150 together form an isolation structure S, in accordance with some embodiments. In some embodiments, the isolation structure S is used to separate the light-sensing regions 118 from one another, and to electrically isolate neighboring devices (e.g. transistors) from one another.

The isolation structure S extends from the back surface 114 into the semiconductor substrate 110, in accordance with some embodiments. The isolation structure S surrounds each of the light-sensing regions 118, in accordance with some embodiments. The isolation structure S is substantially aligned with the isolation structure 120, in accordance with some embodiments.

The isolation structure S is in direct contact with the isolation structure 120, in accordance with some embodiments. In some embodiments, there is no gap (or no semiconductor substrate 110) between end surfaces 120a and S1 of the isolation structures 120 and S. Therefore, the isolation structures 120 and S may reduce optical crosstalk and electrical crosstalk between adjacent light-sensing regions 118.

Figure 1E:
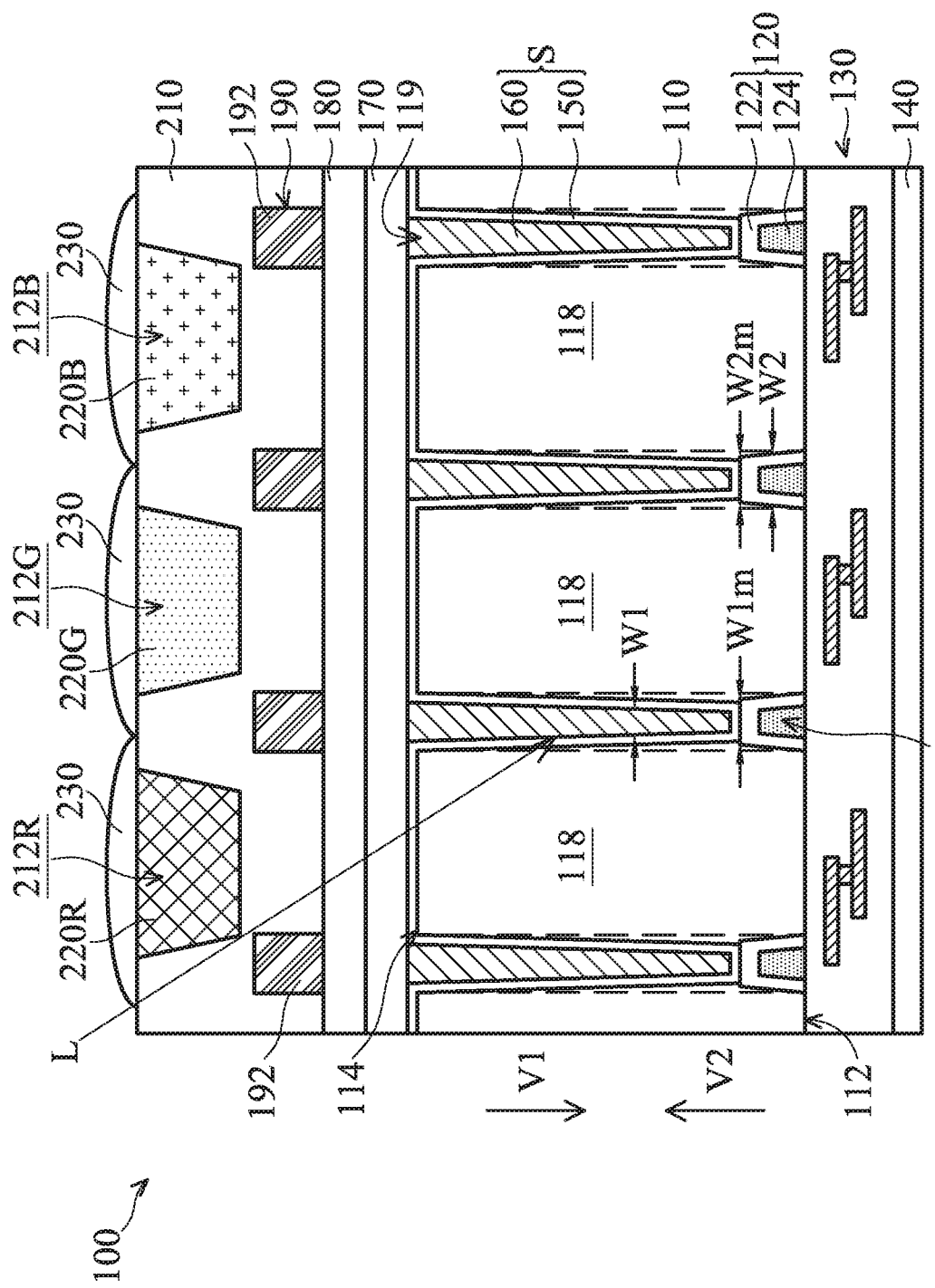

Thereafter, as shown in FIG. 1E, an anti-reflection coating (ARC) layer 170 and a buffer layer 180 are sequentially formed over the back surface 114 of the semiconductor substrate 110, in accordance with some embodiments. The ARC layer 170 is used to reduce optical reflection from the back surface 114 of the semiconductor substrate 110 to ensure that most of an incident light enters the light-sensing regions 118 and is sensed.

The ARC layer 170 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 180 is used as a buffer between the ARC layer 170 and subsequently formed overlying layers. The buffer layer 180 may be made of a dielectric material or other suitable materials. For example, the buffer layer 180 is made of silicon dioxide, silicon nitride, silicon oxynitride, other applicable materials, or a combination thereof.

Thereafter, as shown in FIG. 1E, a reflective grid 190 is formed over the buffer layer 180, in accordance with some embodiments. The reflective grid 190 may include reflective elements 192. In some embodiments, the reflective elements 192 are aligned with the light-blocking structure 160. That is, the reflective elements 192 are right over the light-blocking structure 160, in accordance with some embodiments. In some other embodiments, the reflective elements 192 are not right over the light-blocking structure 160, in accordance with some embodiments. Each of the reflective elements 192 is used to prevent the incident light from entering a neighboring light-sensing region 118. The crosstalk problems between the light-sensing regions 118 are thus prevented or reduced.

In some embodiments, the reflective grid 190 is made of a reflective material such as a metal material. The reflective grid 190 may be made of aluminum, silver, copper, titanium, platinum, tungsten, tantalum, tantalum nitride, other suitable materials, or a combination thereof. In some embodiments, the reflective grid 190 is formed over the buffer layer 180 using a suitable process. The suitable process includes, for example, a PVD process, an electroplating process, a CVD process, other applicable processes, or a combination thereof.

Afterwards, a dielectric layer 210 is formed over the buffer layer 180 to cover the reflective grid 190, in accordance with some embodiments. The dielectric layer 210 may be made of silicon dioxide, silicon nitride, silicon oxynitride, or other suitable materials. The dielectric layer 210 is formed by a CVD process or another suitable process. The dielectric layer 210 has multiple recesses 212R, 212G, and 212B.

Thereafter, visible light filters (such as color filters 220R, 220G, and 220B) are formed in the recesses 212R, 212G, and 212B, respectively. In some embodiments, the visible light filters may be used to filter through visible light. The color filters 220R, 220G, and 220B may be used to filter through a red wavelength band, a green wavelength band, and a blue wavelength band, respectively. In some embodiments, the light-blocking structure 160 includes a non-visible light filter (e.g. an IR filter or a UV filter) enabled to block the visible light passing though the visible light filters.

Afterwards, lenses 230 are respectively formed over the color filters 220R, 220G, and 220B, in accordance with some embodiments. The lenses 230 are used to direct or focus the incident light. The lenses 230 may include a microlens array. The lenses 230 may be made of a high transmittance material. For example, the high transmittance material includes transparent polymer material (such as polymethylmethacrylate, PMMA), transparent ceramic material (such as glass), other applicable materials, or a combination thereof. In this step, an image sensor device 100 is substantially formed, in accordance with some embodiments.

As shown in FIG. 1E, an incident light L passing through the color filters 220R and arriving at the light-blocking structure 160 may be absorbed or reflected by the light-blocking structure 160. Therefore, the light-blocking structure 160 may reduce optical crosstalk between adjacent light-sensing regions 118.

Furthermore, since the isolation structure 120 is in direct contact with the isolation structure S, the isolation structures 120 and S together completely separate the light-sensing regions 118 from one another, in accordance with some embodiments. As a result, the isolation structures 120 and S may further reduce optical crosstalk.

In the image sensor device 100, the isolation structure 120 extends from the front surface 112 into the semiconductor substrate 110, in accordance with some embodiments. The isolation structure 120 surrounds the light-sensing regions 118, in accordance with some embodiments.

The insulating layer 124 extends from the front surface 112 into the semiconductor substrate 110, in accordance with some embodiments. The etch stop layer 122 is positioned between the insulating layer 124 and the isolation structure S, in accordance with some embodiments. The light-blocking structure 160 extends from the back surface 114 into the semiconductor substrate 110, in accordance with some embodiments.

A minimum width W1$m$ of the isolation structure S in the trench 119 is less than a minimum width W2$m$ of the isolation structure 120, in accordance with some embodiments. A width W1 of the isolation structure S in the trench 119 continuously decreases from the back surface 114 to the isolation structure 120 thereunder, in accordance with some embodiments. The width W1 of the isolation structure S in the trench 119 continuously decreases in a direction V1 toward the front surface 112, in accordance with some embodiments.

A width W2 of the isolation structure 120 continuously decreases from the front surface 112 to the isolation structure S thereabove, in accordance with some embodiments. The width W2 of the isolation structure 120 continuously decreases in a direction V2 toward the back surface 114, in accordance with some embodiments.

Figure 3:
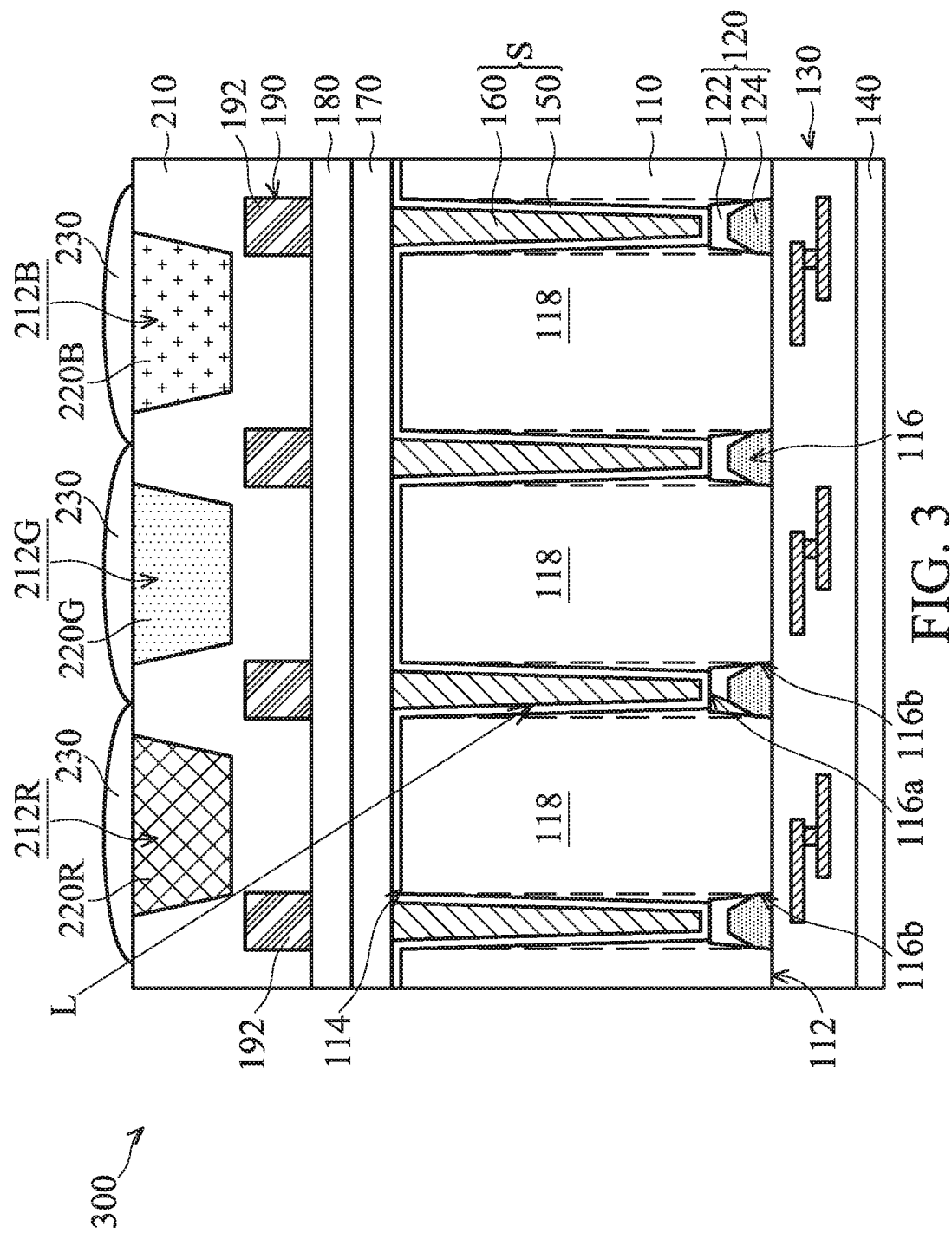
FIG. 3 is a cross-sectional view of an image sensor device, in accordance with some embodiments.

FIG. 3 is a cross-sectional view of an image sensor device 300, in accordance with some embodiments. As shown in FIG. 3, the image sensor device 300 is similar to the image sensor device 100 of FIG. 1E, except that the etch stop layer 122 of the image sensor device 300 covers only a portion of the inner walls 116*b* adjacent to the bottom surface 116*a* of the trench 116, in accordance with some embodiments.

The etch stop layer 122 of the image sensor device 300 does not cover the inner walls 116*b* adjacent to the front surface 112, in accordance with some embodiments. Therefore, the aspect ratio of the trench 116 may be reduced, which may improve the yield of the process for filling the insulating layer 124 into the trench 116.

Figure 4:
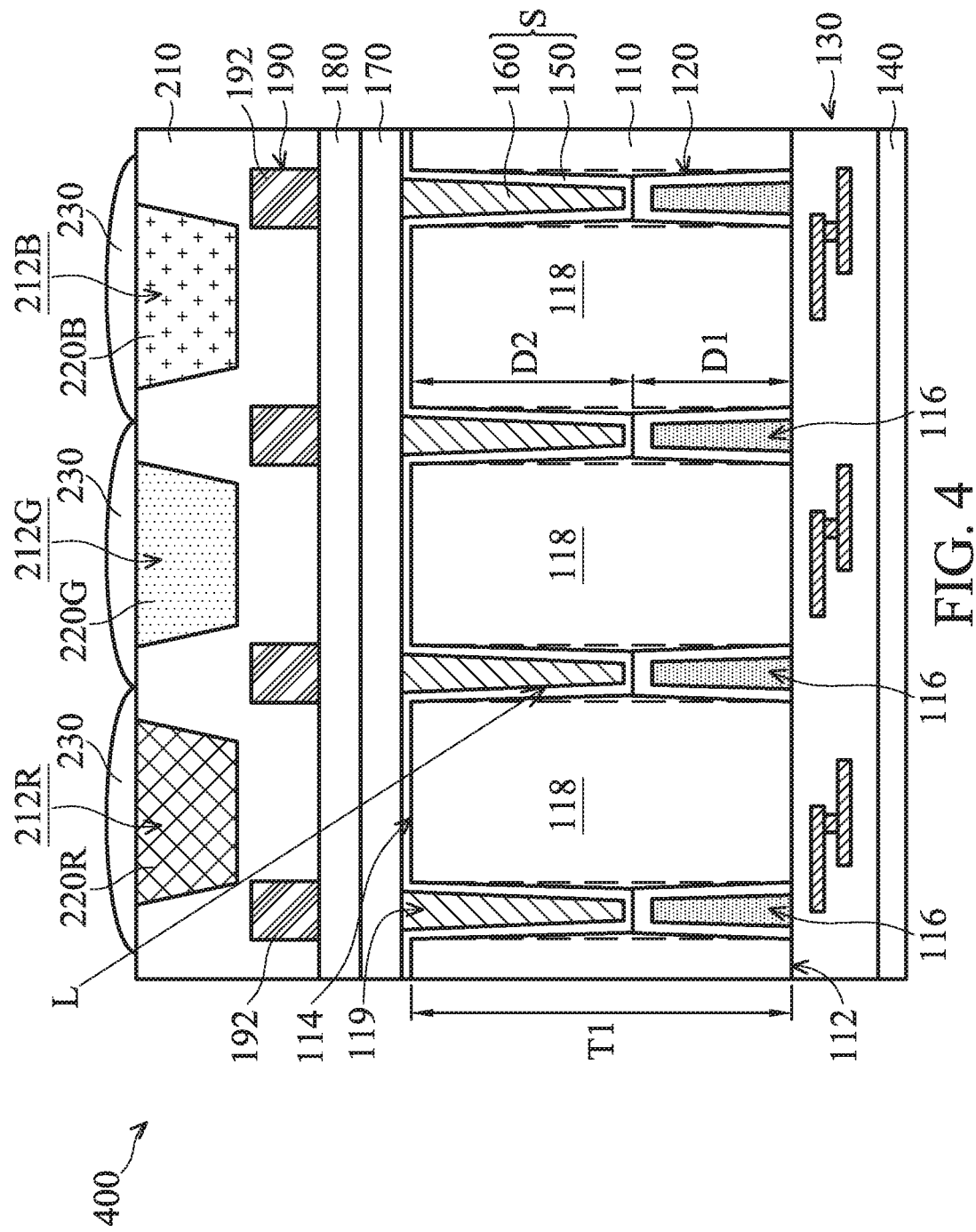
FIG. 4 is a cross-sectional view of an image sensor device, in accordance with some embodiments.

FIG. 4 is a cross-sectional view of an image sensor device 400, in accordance with some embodiments. As shown in FIG. 4, the image sensor device 400 is similar to the image sensor device 100 of FIG. 1E, except that the ratio of the depth D1 of the trench 116 to the thickness T1 of the semiconductor substrate 110 of the image sensor device 400 is greater than that of the image sensor device 100, in accordance with some embodiments. Therefore, the aspect ratio of the trench 119 is reduced.

As a result, the yield of the process for filling the light-blocking structure 160 into the trench 119 is improved. The ratio of the depth D1 of the trench 116 to the thickness T1 of the semiconductor substrate 110 of the image sensor device 400 ranges from about 0.3 to about 0.5.

Figure 5:
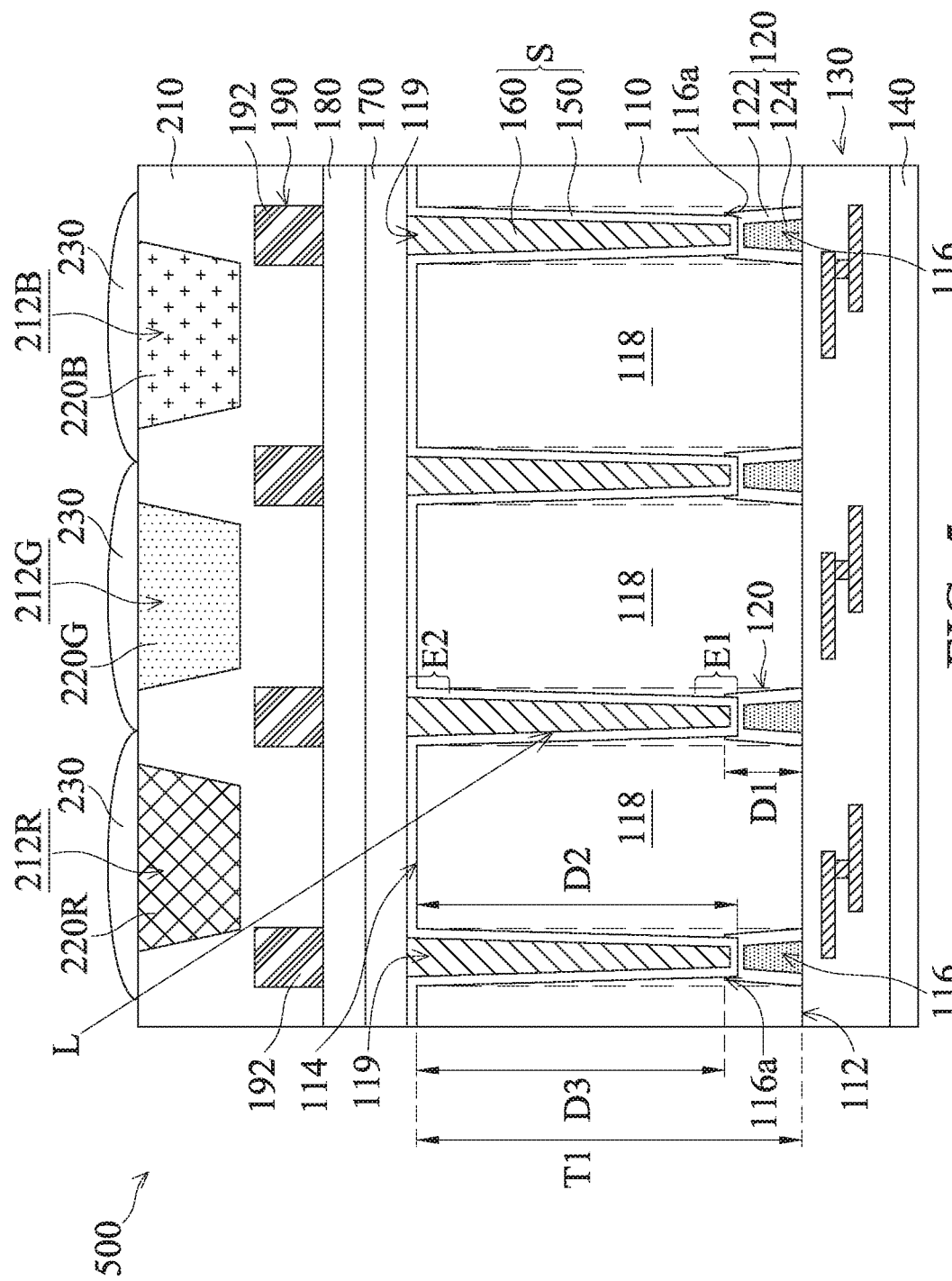
FIG. 5 is a cross-sectional view of an image sensor device, in accordance with some embodiments.

FIG. 5 is a cross-sectional view of an image sensor device 500, in accordance with some embodiments. As shown in FIG. 5, the image sensor device 500 is similar to the image sensor device 100 of FIG. 1E, except that the isolation structure S extends into the isolation structure 120 of the image sensor device 500, in accordance with some embodiments.

The trench 119 extends into the isolation structure 120, in accordance with some embodiments. The isolation structure S in the trench 119 is partially formed in the isolation structure 120, in accordance with some embodiments. The trench 119 extends into the etch stop layer 122, in accordance with some embodiments. The trench 119 does not pass through the etch stop layer 122, in accordance with some embodiments. A portion of the etch stop layer 122 is between the insulating layer 124 and the isolation structure S to separate the insulating layer 124 from the isolation structure S, in accordance with some embodiments.

The isolation structure S has a first end portion E1 and a second end portion E2, in accordance with some embodiments. The first end portion E1 is between the second end portion E2 and the isolation structure 120, in accordance with some embodiments. The first end portion E1 partially extends into the isolation structure 120, in accordance with some embodiments. The first end portion E1 does not pass through the etch stop layer 122, in accordance with some embodiments.

There is a distance D3 between the bottom surface 116*a* of the trench 116 and the back surface 114, in accordance with some embodiments. The depth D2 of the trench 119 is greater than the distance D3, in accordance with some embodiments. The sum of the depths D1 and D2 is greater than the thickness T1 of the semiconductor substrate 110, in accordance with some embodiments.

Figure 6:
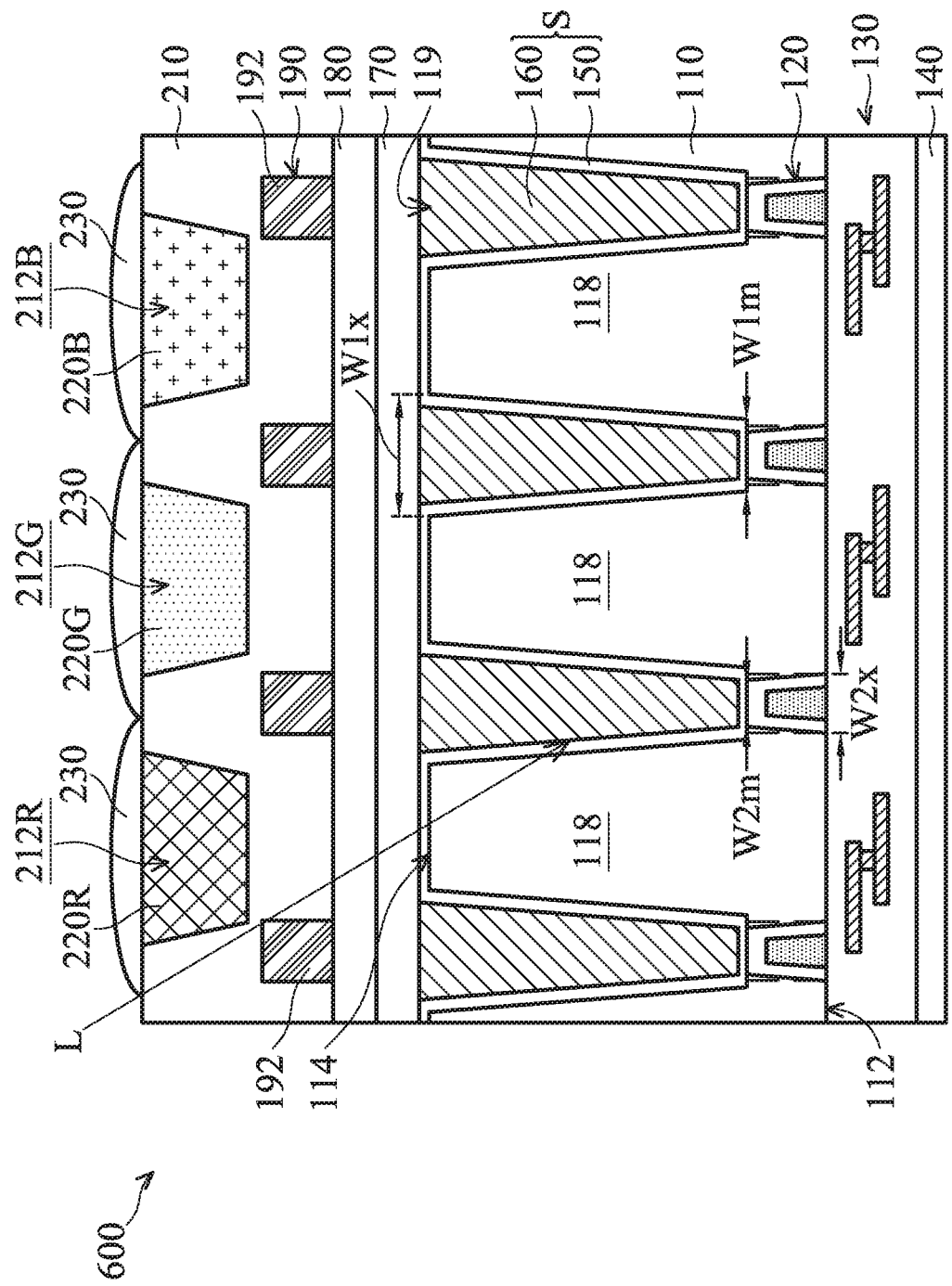
FIG. 6 is a cross-sectional view of an image sensor device, in accordance with some embodiments.

FIG. 6 is a cross-sectional view of an image sensor device 600, in accordance with some embodiments. As shown in FIG. 6, the image sensor device 600 is similar to the image sensor device 100 of FIG. 1E, except that the minimum width W1*m* of the isolation structure S in the trench 119 is greater than the minimum width W2*m* of the isolation structure 120, in accordance with some embodiments. A maximum width W1*x* of the isolation structure S in the trench 119 is greater than a maximum width W2*x* of the isolation structure 120, in accordance with some embodiments.

Figure 7:
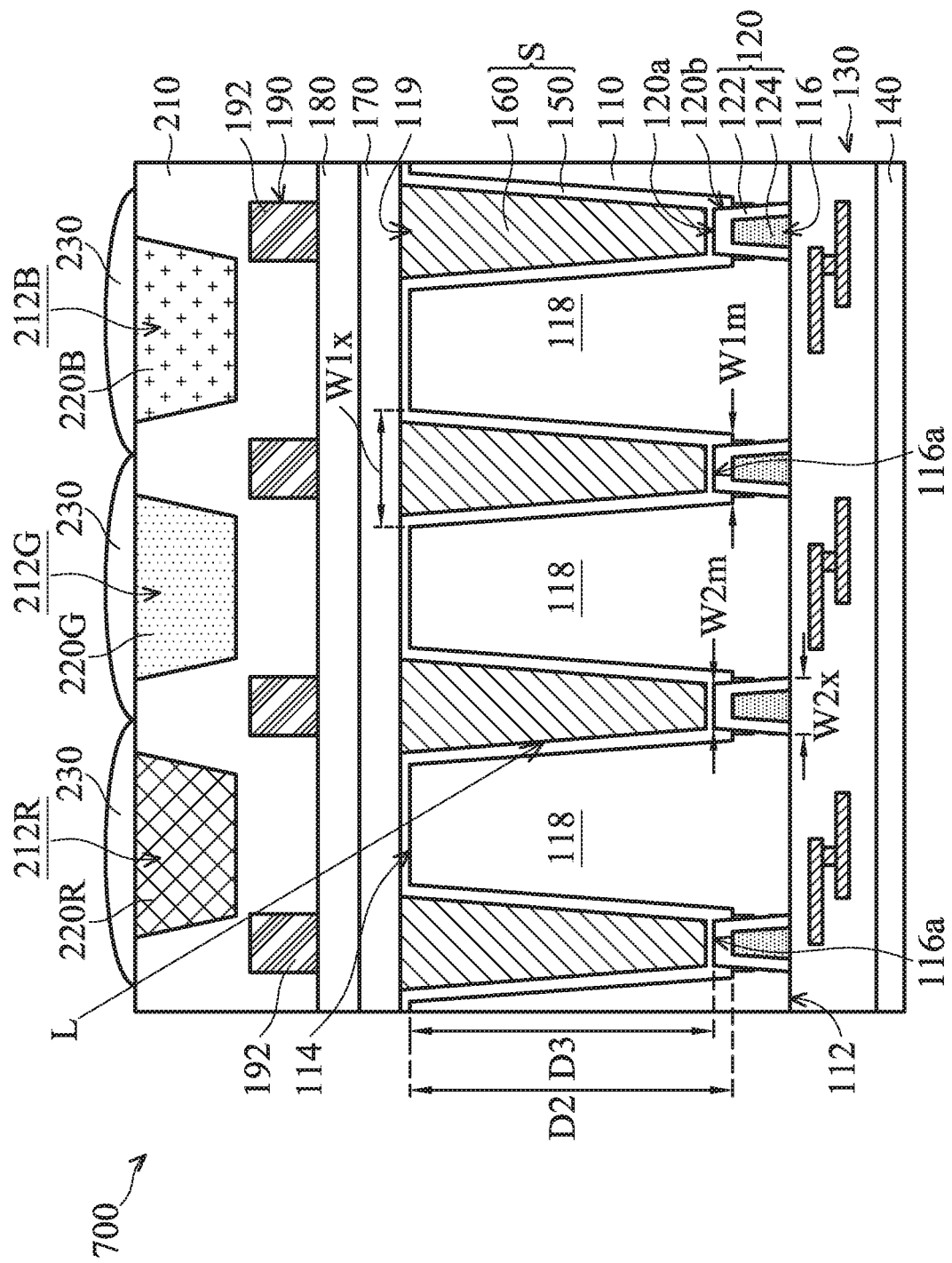
FIG. 7 is a cross-sectional view of an image sensor device, in accordance with some embodiments.

FIG. 7 is a cross-sectional view of an image sensor device 700, in accordance with some embodiments. As shown in FIG. 7, the image sensor device 700 is similar to the image sensor device 600 of FIG. 6, except that the isolation structure 120 partially extends into the isolation structure S, in accordance with some embodiments. The etch stop layer 122 partially extends into the isolation structure S (or the insulating layer 150), in accordance with some embodiments.

There is a distance D3 between the bottom surface 116*a* of the trench 116 and the back surface 114, in accordance with some embodiments. The depth D2 of the trench 119 is greater than the distance D3, in accordance with some embodiments. Before the formation of the isolation structure S, the trench 119 exposes a surface 120*a* and sidewalls 120*b* of the isolation structure 120, in accordance with some embodiments.

The surface 120*a* faces the back surface 114, and the sidewalls 120*b* are adjacent to the surface 120*a*, in accordance with some embodiments. The insulating layer 150 covers the surface 120*a* and the sidewalls 120*b* of the isolation structure 120, in accordance with some embodiments.

Figure 8:
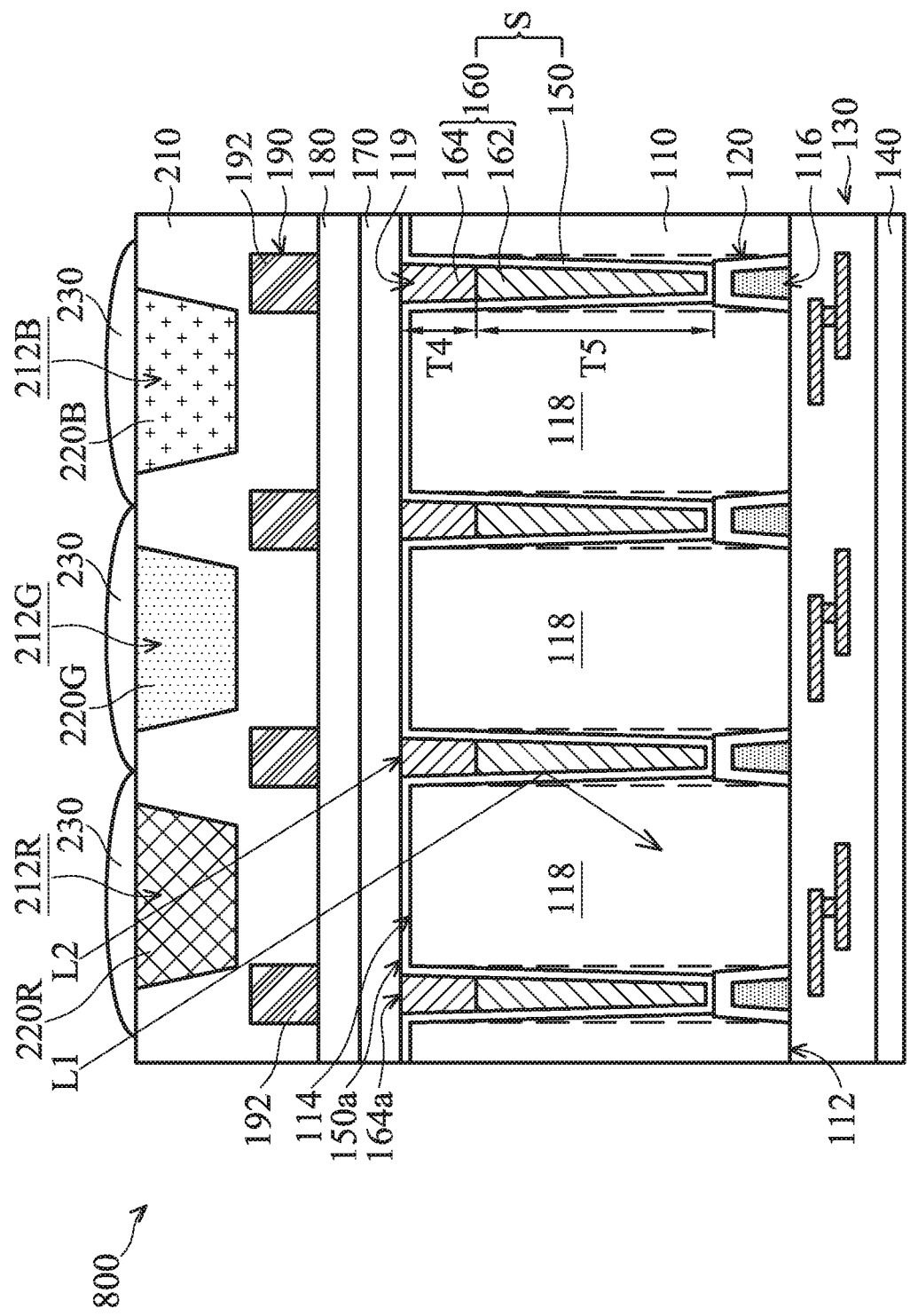
FIG. 8 is a cross-sectional view of an image sensor device, in accordance with some embodiments.

FIG. 8 is a cross-sectional view of an image sensor device 800, in accordance with some embodiments. As shown in FIG. 8, the image sensor device 800 is similar to the image sensor device 100 of FIG. 1E, except that the light-blocking structure 160 of the image sensor device 800 includes a light reflection structure 162 and a light absorption structure 164, in accordance with some embodiments.

The light reflection structure 162 and the light absorption structure 164 are sequentially formed in the trench 119, in accordance with some embodiments. The light absorption structure 164 is formed over the light reflection structure 162, in accordance with some embodiments. The light absorption structure 164 has a top surface 164*a*, in accordance with some embodiments. The top surface 164*a* and the top surface 150*a* of the insulating layer 150 are substantially coplanar, in accordance with some embodiments. The light absorption structure 164 and the light reflection structure 162 are made of different materials, in accordance with some embodiments.

In some embodiments, the light reflection structure 162 has a lower refractive index than that of the semiconductor substrate 110, and therefore a portion of the incident light arriving at the light reflection structure 162 is reflected. The light reflection structure 162 includes dielectric materials, such as silicon dioxides, silicon nitrides, or silicon carbides.

In some embodiments, the light reflection structure 162 has a light reflectivity ranging from about 60% to about 100%. In some embodiments, the light reflection structure 162 includes a metal material or an alloy material. The light reflection structure 162 includes Al, W, Cu, Ti, an alloy thereof, a combination thereof, or another suitable reflective material.

In some embodiments, the light absorption structure 164 has a light absorptivity ranging from about 60% to about 100%. In some embodiments, the light absorption structure 164 is used to absorb the incident light arriving at the light absorption structure 164 to prevent the incident light from traveling between different light-sensing regions 118.

In some embodiments, the light absorption structure 164 includes a black silicon material, a semiconductor material with a band gap smaller than 1.5 eV (e.g., Ge, InSb, or InAs), or a polymer material (e.g., an opaque polymer material). In some embodiments, the light absorption structure 164 includes a non-visible light filter (e.g. an IR filter or a UV filter) enabled to block visible light and transmit non-visible light.

The light absorption structure 164 is positioned closer to the back surface 114 than to the front surface 112, in accordance with some embodiments. The light reflection structure 162 is positioned between the light absorption structure 164 and the isolation structure 120, in accordance with some embodiments. A thickness T4 of the light absorption structure 164 is less than a thickness T5 of the light reflection structure 162, in accordance with some embodiments.

As shown in FIG. 8, an incident light L1 passing through the color filters 220R and arriving at the light reflection structure 162 is reflected by the light reflection structures 162, in accordance with some embodiments. An incident light L2 passing through the color filters 220R and arriving at the light absorption structure 164 may be absorbed by the light absorption structure 164, which prevents the incident light L2 from being reflected to an adjacent light-sensing region 118. Therefore, the light-blocking structure 160 composed of the light reflection structure 162 and the light absorption structure 164 may reduce optical crosstalk.

Figure 9:
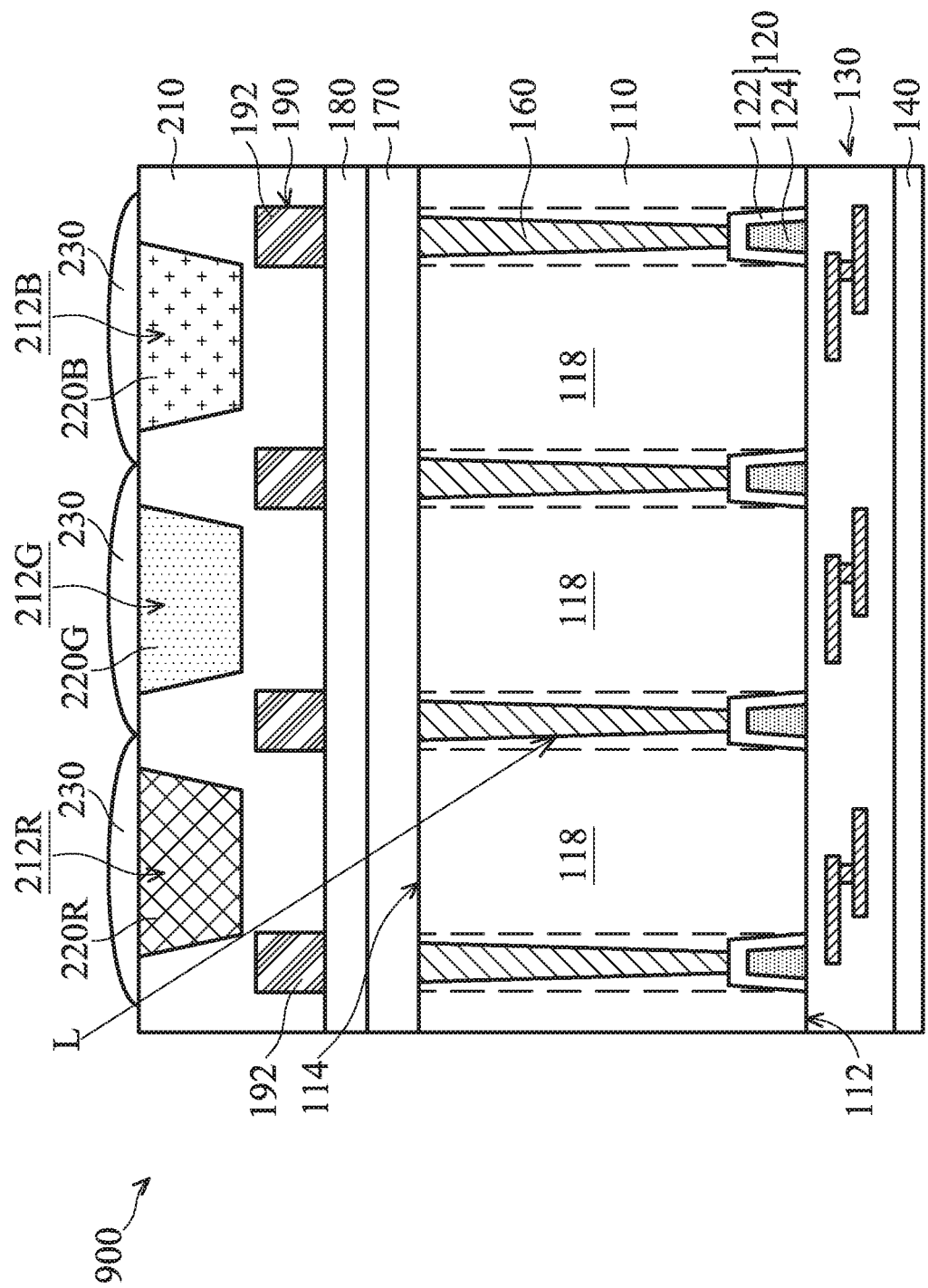
FIG. 9 is a cross-sectional view of an image sensor device, in accordance with some embodiments.

FIG. 9 is a cross-sectional view of an image sensor device 900, in accordance with some embodiments. As shown in FIG. 9, the image sensor device 900 is similar to the image sensor device 100 of FIG. 1E, except that the image sensor device 900 does not have the insulating layer 150 of the image sensor device 100 of FIG. 1E, in accordance with some embodiments. The light-blocking structure 160 is made of an insulating material, in accordance with some embodiments.

The light-blocking structure 160 is in direct contact with the isolation structure 120, in accordance with some embodiments. The light-blocking structure 160 is in direct contact with the etch stop layer 122, in accordance with some embodiments.

Figure 10:
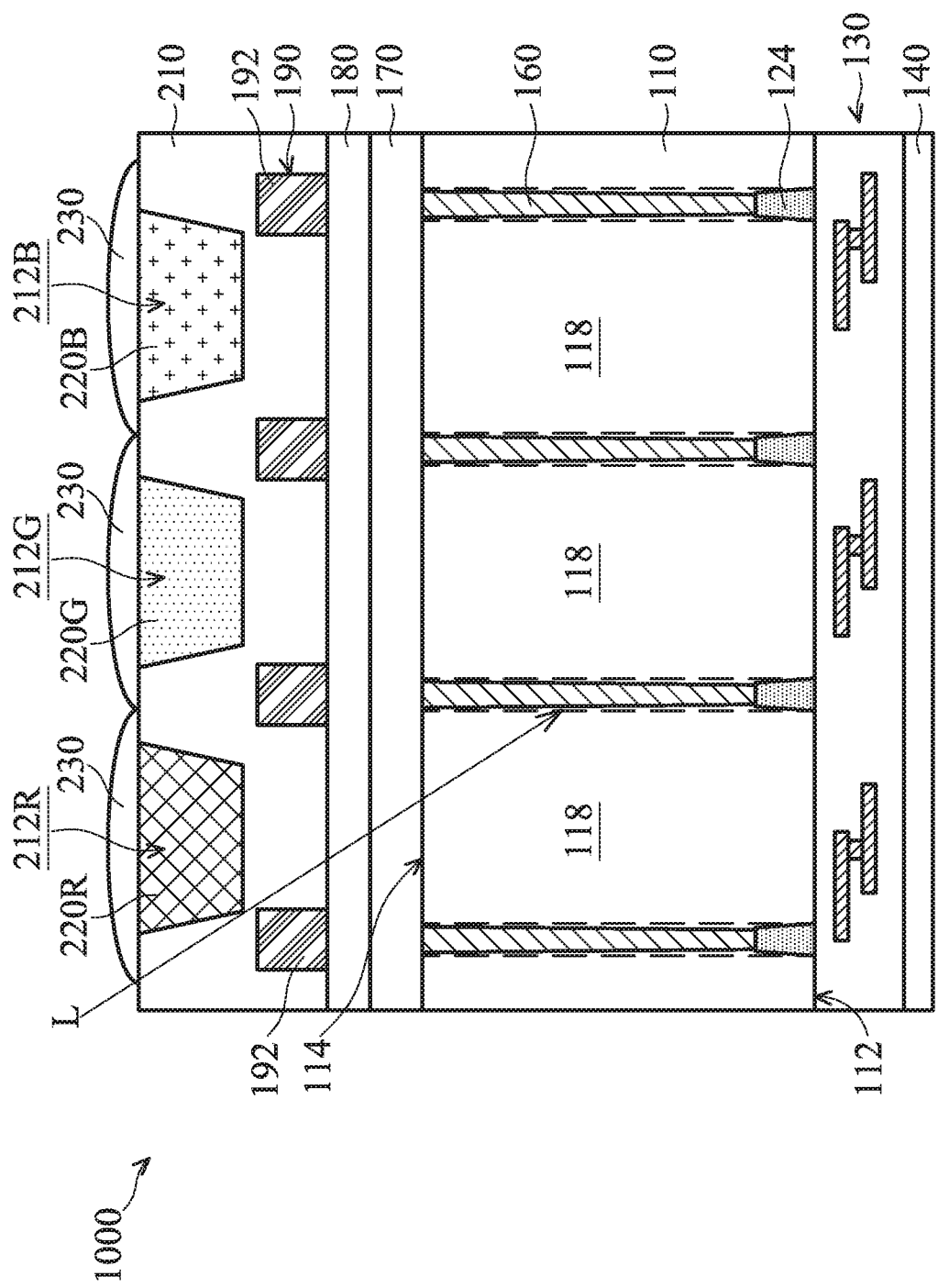
FIG. 10 is a cross-sectional view of an image sensor device, in accordance with some embodiments.

FIG. 10 is a cross-sectional view of an image sensor device, in accordance with some embodiments. As shown in FIG. 10, the image sensor device 1000 is similar to the image sensor device 900 of FIG. 9, except that the image sensor device 1000 does not have the etch stop layer 122 of the image sensor device 900 of FIG. 9, in accordance with some embodiments. The light-blocking structure 160 is in direct contact with the insulating layer 124, in accordance with some embodiments.

In accordance with some embodiments, image sensor devices and methods for forming the same are provided. The methods (for forming the image sensor devices) form a first isolation structure and a second isolation structure in a semiconductor substrate and between adjacent light-sensing regions of the semiconductor substrate. The semiconductor substrate has a front surface and a back surface. The first isolation structure and the second isolation structure respectively extend from the front surface and the back surface and meet each other in the semiconductor substrate. The light-sensing regions are completely separated from each other by the first isolation structure and the second isolation structure. Therefore, the first isolation structure and the second isolation structure may block incident light arriving at the first isolation structure and the second isolation structure to prevent the incident light from traveling between adjacent light-sensing regions. Therefore, optical crosstalk between the light-sensing regions is reduced. The first isolation structure and the second isolation structure may electrically isolate the light-sensing regions from one another to reduce electrical crosstalk between the light-sensing regions.

In accordance with some embodiments, an image sensor device is provided. The image sensor device includes a substrate having a front surface, a back surface, and a light-sensing region. The image sensor device includes a first isolation structure extending from the front surface into the substrate. The first isolation structure surrounds the light-sensing region, the first isolation structure includes a first insulating layer and an etch stop layer, the first insulating layer extends from the front surface into the substrate, the etch stop layer is between the first insulating layer and the substrate, and the etch stop layer, the first insulating layer, and the substrate are made of different materials. The image sensor device includes a second isolation structure extending from the back surface into the substrate. The second isolation structure is in direct contact with the etch stop layer, the second isolation structure surrounds the light-sensing region, and the second isolation structure includes a light-blocking structure.

In accordance with some embodiments, an image sensor device is provided. The image sensor device includes a substrate having a front surface, a back surface, and a light-sensing region. The image sensor device includes a first isolation structure extending from the front surface into the substrate. The first isolation structure surrounds the light-sensing region. The image sensor device includes a second isolation structure extending from the back surface into the substrate and the first isolation structure. The second isolation structure surrounds the light-sensing region, the second isolation structure has a first end portion in the first isolation structure, the first end portion has an end surface and a sidewall adjacent to the end surface, the first isolation structure covers the end surface and the sidewall, and the second isolation structure includes a light-blocking structure.

In accordance with some embodiments, an image sensor device is provided. The image sensor device includes a substrate having a front surface, a back surface, and a light-sensing region. The image sensor device includes a first isolation structure extending from the front surface into the substrate. The first isolation structure surrounds the light-sensing region. The image sensor device includes a second isolation structure extending from the back surface into the substrate. The second isolation structure surrounds the light-sensing region, the first isolation structure is partially embedded in the second isolation structure, and the second isolation structure includes a light-blocking structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a substrate having a front surface, a back surface, and a light-sensing region;
a first isolation structure extending from the front surface into the substrate, wherein the first isolation structure surrounds the light-sensing region, the first isolation structure comprises a first insulating layer and an etch stop layer, the first insulating layer extends from the front surface into the substrate, the etch stop layer is between the first insulating layer and the substrate, and the etch stop layer, the first insulating layer, and the substrate are made of different materials; and
a second isolation structure extending from the back surface into the substrate, wherein the second isolation structure is in direct contact with the etch stop layer, the second isolation structure surrounds the light-sensing region, the second isolation structure comprises a light-blocking structure, the light-blocking structure extends from the back surface into the substrate, and
the second isolation structure further comprises:
a second insulating layer between the light-blocking structure and the substrate and between the light-blocking structure and the etch stop layer, the etch stop layer is in direct contact with the first insulating layer, the second insulating layer, and the substrate, the second insulating layer is partially in the first isolation structure, the second insulating layer is partially in the etch stop layer, and the etch stop layer is between the first insulating layer and the second insulating layer.

2. The image sensor device as claimed in claim 1, wherein the second insulating layer is in direct contact with the etch stop layer.

3. The image sensor device as claimed in claim 1, wherein the light-blocking structure is partially in the first isolation structure.

4. The image sensor device as claimed in claim 1, wherein the first insulating layer has an end surface and a sidewall adjacent to the end surface, the end surface faces the second isolation structure, and the etch stop layer continuously covers the end surface and the sidewall.

5. The image sensor device as claimed in claim 1, wherein the light blocking structure comprises a light reflection structure with a first refractive index lower than a second refractive index of the substrate.

6. The image sensor device as claimed in claim 1, wherein the etch stop layer between the first insulating layer and the second insulating layer is thinner than the first insulating layer.

7. The image sensor device as claimed in claim 1, wherein an upper portion of the etch stop layer has a substantially H-like shape in a cross-sectional view of the etch stop layer.

8. The image sensor device as claimed in claim 1, wherein the etch stop layer wraps around the first insulating layer.

9. An image sensor device, comprising:
a substrate having a front surface, a back surface, and a light-sensing region;
a first isolation structure extending from the front surface into the substrate, wherein the first isolation structure surrounds the light-sensing region; and
a second isolation structure extending from the back surface into the substrate and the first isolation structure, wherein the second isolation structure surrounds the light-sensing region, the second isolation structure has a first end portion in the first isolation structure, the first end portion has an end surface and a sidewall adjacent to the end surface, the first isolation structure covers the end surface and the sidewall, and the second isolation structure comprises a light-blocking structure.

10. The image sensor device as claimed in claim 9, wherein the first isolation structure comprises an insulating layer and an etch stop layer, the insulating layer extends from the front surface into the substrate, the etch stop layer wraps around the insulating layer, the etch stop layer covers the end surface and the sidewall, and the etch stop layer, the insulating layer, and the substrate are made of different materials.

11. The image sensor device as claimed in claim 9, wherein the first isolation structure has a second end portion, the first end portion is embedded in the second end portion, and the second end portion is wider than the first end portion.

12. The image sensor device as claimed in claim 9, wherein the light blocking structure comprises a light reflection structure, and the light reflection structure is made of a metal material or an alloy material.

13. The image sensor device as claimed in claim 9, wherein the light blocking structure comprises a light absorption structure with a light absorptivity ranging from about 60% to about 100%.

14. An image sensor device, comprising:
a substrate having a front surface, a back surface, and a light-sensing region;
a first isolation structure extending from the front surface into the substrate, wherein the first isolation structure surrounds the light-sensing region; and
a second isolation structure extending from the back surface into the substrate, wherein the second isolation structure surrounds the light-sensing region, the first isolation structure is partially embedded in the second isolation structure, the second isolation structure comprises a light-blocking structure, a first end portion of the first isolation structure is partially embedded in a second end portion of the second isolation structure, and the second end portion is wider than the first end portion.

15. The image sensor device as claimed in claim 14, wherein the first isolation structure comprises a first insulating layer and an etch stop layer, the first insulating layer extends from the front surface into the substrate, the etch stop layer wraps around the first insulating layer, and the etch stop layer is partially embedded in the second isolation structure.

16. The image sensor device as claimed in claim 15, wherein the light-blocking structure extends from the back surface into the substrate, and the second isolation structure further comprises:
a second insulating layer between the light-blocking structure and the substrate and between the light-blocking structure and the etch stop layer.

17. The image sensor device as claimed in claim 16, wherein the etch stop layer is partially embedded in the second insulating layer.

18. The image sensor device as claimed in claim 16, wherein the second insulating layer wraps around a portion of the etch stop layer.

19. The image sensor device as claimed in claim 18, wherein the etch stop layer has an end surface and a sidewall adjacent to the end surface, the end surface faces the second isolation structure, and the second insulating layer continuously covers the end surface and the sidewall.

20. The image sensor device as claimed in claim 15, wherein the light-sensing region surrounded by the first isolation structure is wider than the light-sensing region surrounded by the second isolation structure.

\* \* \* \* \*